United States Patent
Miller et al.

[11] Patent Number: 5,804,967
[45] Date of Patent: Sep. 8, 1998

[54] APPARATUS AND METHOD FOR GENERATING SHORT PULSES FOR NMR AND NQR PROCESSING

[75] Inventors: Joel B. Miller, Cheverly; Allen N. Garroway, Fort Washington, both of Md.

[73] Assignee: The United States of America as represented by the Secretary of the Navy, Washington, D.C.

[21] Appl. No.: 749,483

[22] Filed: Nov. 15, 1996

[51] Int. Cl.⁶ .................................................. G01V 3/00
[52] U.S. Cl. ........................................ 324/314; 324/307
[58] Field of Search .................................. 324/314, 300, 324/306, 307, 309, 312

[56] References Cited

U.S. PATENT DOCUMENTS

| | | | |
|---|---|---|---|
| 3,808,518 | 4/1974 | Ignatov et al. | 324/300 |
| 3,921,060 | 11/1975 | Ekimovskikh et al. | 324/314 |
| 4,087,738 | 5/1978 | Van Degrift et al. | 324/300 |
| 4,733,182 | 3/1988 | Clarke et al. | 324/301 |
| 4,887,034 | 12/1989 | Smith | 324/307 |
| 5,036,279 | 7/1991 | Jonsen | 324/307 |
| 5,159,617 | 10/1992 | King et al. | 378/57 |
| 5,168,224 | 12/1992 | Maruizumi et al. | 324/300 |
| 5,206,592 | 4/1993 | Buess et al. | 324/307 |
| 5,229,722 | 7/1993 | Rommel et al. | 324/307 |
| 5,233,300 | 8/1993 | Buess et al. | 324/307 |
| 5,365,171 | 11/1994 | Buess et al. | 324/307 |
| 5,457,385 | 10/1995 | Sydney et al. | |
| 5,592,083 | 1/1997 | Magnuson et al. | 324/300 |
| 5,619,138 | 4/1997 | Rourke | 324/314 |

OTHER PUBLICATIONS

Mark S. Conradi, et al., *Generation of Short, Intense Gradient Pulses*, Journal of Magnetic Resonance 94, 370–375 (1991).

G.L. Hoatson et al., *Deuteron Hadamard NMR of Solids and Liquid Crystals*, Journal of Magnetic Resonance, 95, 446 (1991).

M. Greferath et al., *Saturation in Deuteron Hadamard NMR Spectros–copy of Solids*, Journal of Magnetic Resonance, Series A, 102, 73 (1992).

*Primary Examiner*—Louis M. Arana
*Attorney, Agent, or Firm*—Thomas E. McDonnell; Edward F. Miles

[57] ABSTRACT

An apparatus using nuclear magnetic or quadrupole resonance to detect selected nuclei in a specimen (e.g., specimens containing a class of explosives or narcotics). The apparatus includes a pulsing unit to generate an RF pulse or a train of pseudo-random RF pulses used in stochastic NQR. Each of the pulses has an RF signal reaching a full amplitude within a quarter-cycle (substantially no pulse rise delay) and having a recovery delay of less than $Q/\pi$ cycles (substantially no recovery delay). The apparatus also includes a transmitter (e.g., a coil) to irradiate the specimen with a train of pseudo-random RF pulses and to detect after each pulse a resonance signal generated by the specimen in response to each corresponding pulse of the train of pseudo-random RF pulses. The pulsing unit has a capacitor connected to a DC power source by a first switch and connected to the coil by a second switch. When the first switch is closed, the DC power source charges the capacitor. After the first switch is opened, the capacitor generates the pulses through the closing and opening of the second switch. The second switch disconnects the coil from the capacitor to end a pulse transmission when the voltage across the coil y is at zero, thereby allowing immediate reception and detection of resonance signals.

13 Claims, 7 Drawing Sheets

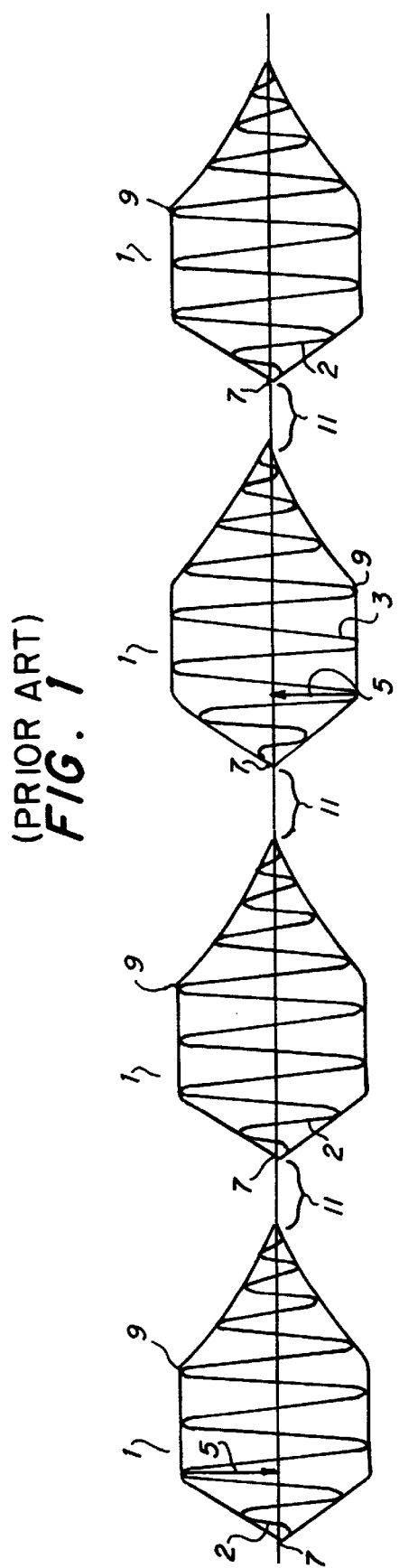
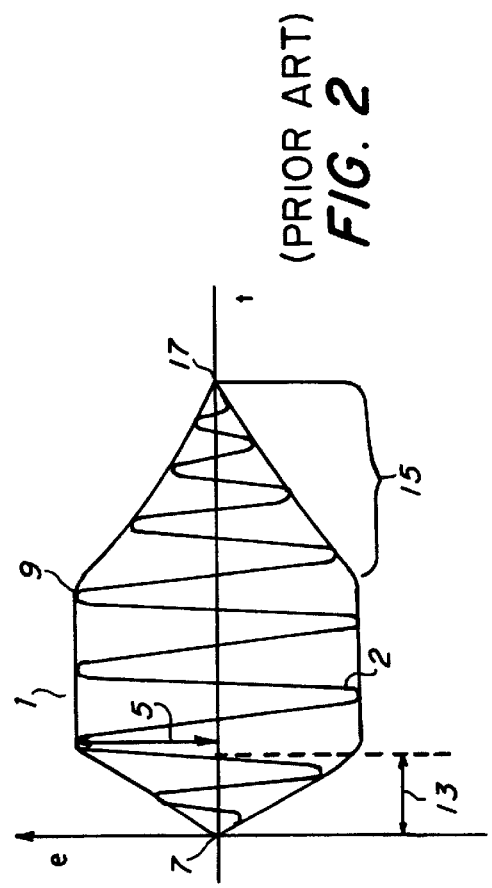
FIG. 1 (PRIOR ART)
FIG. 2 (PRIOR ART)

APPARATUS AND METHOD FOR GENERATING SHORT PULSES FOR NMR AND NQR PROCESSING

BACKGROUND OF THE INVENTION

1. Field of the Invention

The present invention relates to stochastic nuclear quadrupole resonance (NQR). More specifically, the present invention relates to an improved apparatus to generate short pulses for stochastic NQR.

2. Description of the Related Art

With the unfortunate increase in drug traficking and terrorist use of high explosives in aircrafts and buildings, there is a strong interest for a reliable detection system that can detect sub-kilogram quantities of narcotics and explosives against a background of more benign materials in a rapid, accurate, and noninvasive fashion.

Nuclear quadrupole resonance (NQR) is a technique for detecting target specimens containing such sub-kilogram quantities of narcotics and explosives having quadrupolar nuclei, such as in nitrogenous or chlorine-containing explosives and narcotics (where the spin quantum number $I \geq 1$, such as in $^{14}N$, $^{35,37}Cl$, $^{39}K$, etc.). Basically, quadrupolar nuclei will exhibit nuclear quadrupole resonance—a change in the angle of nuclear spin with respect to its quantization axis when it is excited by radio frequency (RF) radiation pulses at a particular frequency. In the better-known nuclear magnetic resonance (NMR), the quantization axis is determined externally by the direction of the applied magnetic field. In NQR, the quantization axis is determined by molecular parameters. As with NMR, different chemicals require pulses of different frequencies (i.e., different nuclear quadrupole resonance frequencies) to cause precession in nuclei. A device used to detect magnetic or NQR resonance in the quadrupolar nuclei of a target specimen is tuned to emit pulses at the frequency corresponding to the resonance frequency of the nuclei desired to be detected. A typical NQR excitation/detection circuit consists of an inductor capacitively tuned to the NQR frequency and nominally matched to the impedance of a transmitter or receiver by another capacitor or inductor. In this regard, the present invention is related to other methods of NQR detection as taught in U.S. Pat. No. 5,206,592 issued Apr. 27, 1993 to Buess et al. for DETECTION OF EXPLOSIVES BY NUCLEAR QUADRUPOLE RESONANCE, and U.S. Pat. No. 5,233,300 issued Aug. 3, 1993 to Buess et al. for DETECTION OF EXPLOSIVE AND NARCOTICS BY LOW POWER LARGE SAMPLE VOLUME NUCLEAR QUADRUPOLE RESONANCE, and U.S. patent application Ser. No. 07,983,390, Navy Case No. 74,325,filed Nov. 30, 1992, for REMOVING THE EFFECTS OF ACOUSTIC RINGING AND REDUCING THE TEMPERATURE EFFECTS IN THE DETECTION OF EXPLOSIVES BY NQR (all of which are incorporated by reference herein).

Detection of nuclear quadrupole resonance by stochastic NQR (a type of NQR technique) has been a continuing concern in the art. See U.S. patent application Ser. No. 08,583,146, Navy Case No. 76,330, filed Dec. 28, 1995, for METHOD AND APPARATUS FOR DETECTING TARGET SPECIES QUADRUPOLAR NUCLEI BY STOCHASTIC NQR (hereinafter, Garroway et. al.), incorporated by reference herein. In general, stochastic NQR is a type of NQR technique in which ransom or pseudo-random RF pulses are used. FIG. 1 shows an example of a train of pseudo-random RF pulses 1 transmitted to a target sample. The RF pulse signals 2 and 3 for each RF pulse 1 have the same maximum amplitude 5. The frequency of the RF pulse signale 2 and 3 is tuned to the resonance frequency of the quadrupolar nuclei desired to be detected. The pseudo-random nature of the train of pulses is in the variation between positive RF pulse signals 2 and negative RF pulse signals 3 (i.e., RF signals phase-shifted between 0° and 180°) in a sequence of RF pulses. A particular sequence of positive and negative RF pulses will repeat over time. An apparatus using stochastic NQR causes a pulse to be generated at each pulse generation time 7. Each pulse is then cut off at each time 9, so that a resonance signal from the target specimen may be detected during a period 11 between each pulse. The resonance signals detected during each period 11 are processed and analyzed to determine the presence of the narcotic or explosive with the quadrupolar nuclei desired to be detected.

Stochastic NQR requires very short RF pulses with a moderate duty cycle, thereby reducing the peak RF power requirements for the detection of quadruolar nuclei relative to present techniques. A reduction in required peak RF power is expected to improve system portability, transportability, cost and reliability over present approaches. Stochastic approaches may also increase signal sensitivity and hence detectability. Moreover, inspection of very large specimens may be possible with the reduced power requirements of stochastic NQR.

In addition to the requirement of short RF pulses (e.g., on the order of 1–100 µs in duration), stochastic NQR also requires the almost immediate start of signal detection after each pulse. However, these requirements of stochastic NQR are difficult to meet at low NQR frequencies, e.g., below 10 MHz. To detect weak NQR signals, the circuit must also have a fairly high Q (a quality factor of the circuit, well known by one of ordinary skill in the electronic arts).

Pulsing circuits which are conventionally used in NMR or NQR testing to excite magnetic or quadrupole resonance in nuclei of a test material are in the form of a stable frequency source driving a following amplifier, which in turn drives a tuned circuit containing a detector element such as an inductive coil. Such circuits are highly stable and allow precise signal repeatability. This permits one to employ a range of investigative and diagnostic techniques which depend on precise phase stability from one pulse to another, and high temporal coherence among the pulses. However, tuned circuits cause delays in pulse rise time, and delays in circuit discharge after nominal pulse cutoff. The latter is especially troublesome because residual energy dissipates through electric "ringing" of the coil. A large ringing inhibits weak signal (NMR, NQR) detection until the amplitude of the ringing becomes less than or approximately equal to the signal amplitude. When the coil ringing persists for long times, detection of rapidly decaying nuclear resonance signals becomes difficult or impossible. The detection of nitrogen and chlorine isotopes associated with explosives or narcotics suffer from this problem.

For example, consider a circuit tuned to 1 MHz, with a Q of 100. When an RF pulse is applied to the circuit, it takes on the order of 100 µs for the RF pulse signal to rise to its full amplitude. FIG. 2 illustrates that RF pulse signals generated by conventional methods experience a pulse rise delay 13 before the RF signal reaches a cycle with the full amplitude 5. This pulse rise delay 13 prevents the achievement of very short and rapid pulsing. In addition, once the transmitting pulse is turned off, it can take on the order of 1 ms for the RF pulse signal in the inductor to decay to an acceptably low level before signal detection can begin. FIG. 2 illustrates this phenomenon of "ringing" in which a delay due to energy dissipation (or a recovery delay 15) exists before the system can fully recover and begin signal detection. The recovery delay 15 is typically twenty time constants for a single LCR circuit, where the time constant is Q/πf and f is the frequency of the pulse signal (in Hz). Signal detection can only start after the recovery delay 15 is imposed on the circuit to allow the coil energy to subside at time 17. The recovery delay 15 after each pulse is turned off prevents the immediate (or nearly instantaneous) start of signal detection after each pulse. Thus, conventional methods prevent the achievement of very short and rapid pulsing. Clearly, these conditions are not suitable for the very short RF pulses and rapid recovery required for many applications of NQR or NMR.

The article *Generation of Short, Intense Gradient Pulses* by Conradi et al. (J. MAGNETIC RESONANCE, 94, 340–75 (1991), incorporated herein by reference) proposes a tank circuit driven by a DC power supply to generate short magnetic field gradient pulses. However, while the article by Conradi et al. is directed to producing a macroscopic magnetic field gradient across a bulk sample for NMR imaging, there is no discussion in that cited work of the exacting requirements necessary for detecting the weak signals associated with the nitrogen and chlorine isotopes found in explosives or narcotics, nor the relevance or applicability of the tank circuit to generating RF pulses to detect weak resonance signals, such as in nuclear magnetic or quadrupole resonance. As mentioned above, rapid pulse rise time and quick detector recovery time are critical to the detection of certain compounds of interest. Conventional applications of NMR are directed to resonance signals in the tens to hundreds of MHz domain. Therefore, only conventional pulse generators have been considered heretofore in the low frequency regimes of nuclear magnetic or quadrupole resonance despite the required rapid recovery times to detect weak resonance signals. The present invention overcomes the obstacles discussed above in the detection of explosives and narcotics having weak resonance signals. In addition, the present invention further shows that a tank circuit, similar to that of Conradi et al., can be used to generate RF pulses to excite nuclear magnetic or quadrupole resonance, which is especially useful in stochastic NMR or NQR applications employing a train of pseudo-random RF pulses.

SUMMARY OF THE INVENTION

Accordingly, it is an object of the present invention to provide an apparatus to generate RF pulses for nuclear magnetic or quadrupole resonance with its RF pulse signal reaching a full amplitude within a quarter-cycle (i.e., pulses with substantially no pulse rise delay).

It is an additional object of the present invention to provide an apparatus using NMR or stochastic NQR with substantially no recovery delay (i.e., a recovery delay of less than Q/π cycles of the RF pulse signal) after a pulse is turned off so that signal detection may start almost immediately after each pulse.

It is a further object of the present invention to reduce costs and improve economies of scale in producing an apparatus according to the present invention.

Additional objects and advantages of the invention will be set forth in part in the description which follows, and, in part, will be obvious from the description, or may be learned by practice of the invention.

The foregoing objects of the present invention are achieved by providing an apparatus using nuclear magnetic or quadrupole resonance to detect selected nuclei in a specimen (e.g., specimens containing a class of explosives or narcotics). The apparatus includes a pulsing unit to generate an RF pulse or a train of pseudo-random RF pulses used in stochastic NMR or NQR. Each of the pulses has an RF signal reaching a full amplitude within a quarter-cycle (substantially no pulse rise delay) and having a recovery delay of less than Q/π cycles (substantially no recovery delay). The apparatus also includes a transmitter (e.g., a coil) to irradiate the specimen with a train of pseudo-random RF pulses and to detect after each pulse a resonance signal generated by the specimen in response to each corresponding pulse of the train of pseudo-random RF pulses. The pulsing unit has a capacitor connected to the DC power source by a first switch and connected to the coil by a second switch. When the first switch is closed, the DC power source charges the capacitor. When the first switch is opened, the capacitor generates the pulses by closing and opening the second switch. The second switch disconnects the coil from the capacitor to end a pulse transmission when the voltage across the coil is at zero, thereby allowing immediate reception and detection of resonance signals.

Objects of the present invention are also achieved by providing a control unit connected to the pulsing unit to determine a pseudo-random sequence for the radio frequency pulses and further connected to the coil to receive and process the resonance signals to determine the presence of explosives or narcotics.

Objects of the present invention are also achieved by providing a radio frequency receiver amplifier connected to the control unit to receive and amplify the resonance signal detected by the coil. In addition, a coupling network may connect the coil to the pulsing unit and the radio frequency receiver amplifier, to switch connections to the coil between the pulsing unit to generate the pulses and the radio frequency receiver amplifier to receive the resonance signal after the pulses. A frequency synthesizer may also be connected to the control unit to demodulate the resonance signal and an alarm may be connected to the control unit to generate an alarm when said control unit determines the presence of explosives or narcotics.

BRIEF DESCRIPTION OF THE DRAWINGS

These and other objects and advantages of the invention will become apparent and more readily appreciated from the following description of the preferred embodiments, taken in conjunction with the accompanying drawings of which:

FIG. 1 is a diagram illustrating a train of pseudo-random RF pulses generated by conventional methods;

FIG. 2 is a graph illustrating a pulse rise delay and a recovery delay in a pulse of FIG. 1 generated by conventional methods;

DESCRIPTION OF THE PREFERRED EMBODIMENTS

Figure 3:
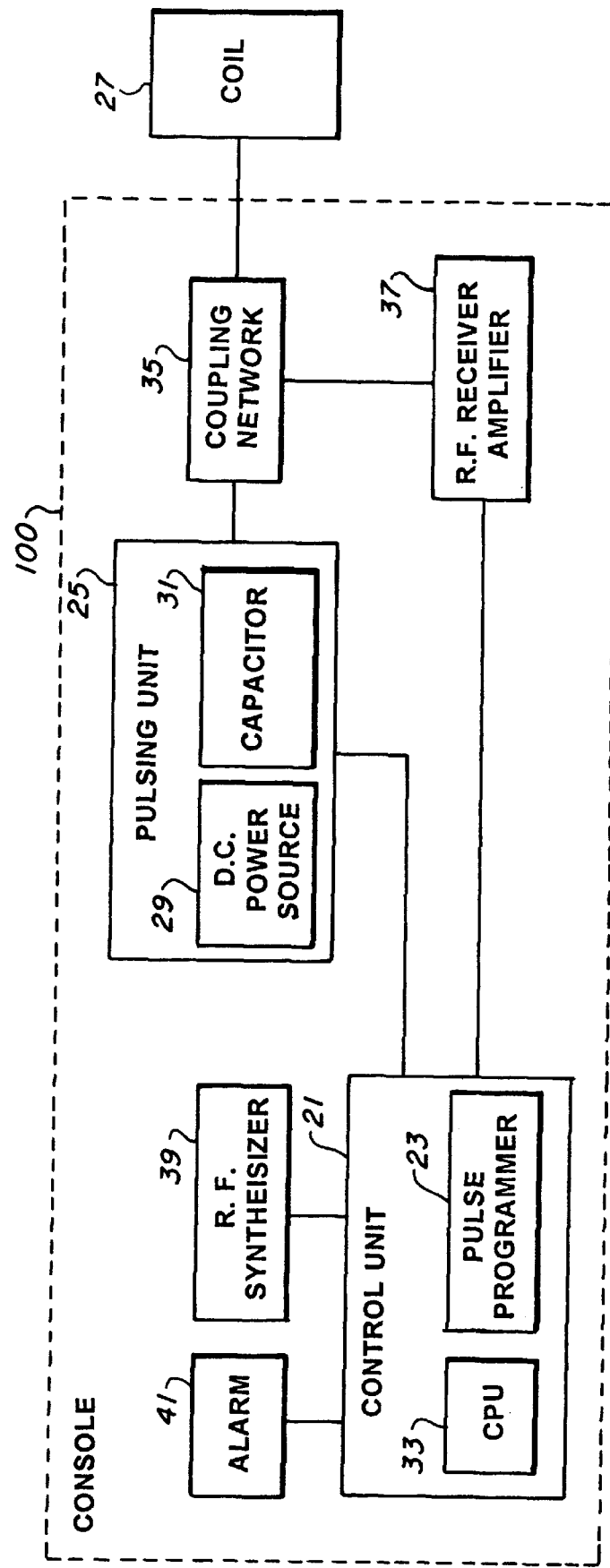
FIG. 3 is a block diagram illustrating an apparatus according to the present invention.

Reference will now be made in detail to the present preferred embodiments of the present invention, examples of which are illustrated in the accompanying drawings, wherein like reference numerals refer to like elements throughout.

A preferred embodiment of the present invention utilizes stochastic nuclear quadrupole resonance (NQR). However, the discussion concerning stochastic NQR is exemplary. The apparatus and methods described below are pulse generators to excite NMR or NQR signals. Accordingly, the discussion directed to stochastic NQR is also relevant to NMR and NQR processes in general.

In stochastic NQR, as taught in Garroway et. al., a target specimen is irradiated with a train of short random or pseudo-random radio frequency (RF) pulses. The frequency of the radio frequency signal of each pulse is chosen to be near the known resonance frequency of the explosive or narcotic. During excitation by a stochastic (i.e., a random or pseudo-random) RF pulse train, a specimen containing quadrupole nuclei will return a stochastic response. The stochastic response is cross-correlated into a free induction decay curve and then converted into a frequency domain signal so that a frequency domain NQR spectrum of the target specimen may be obtained.

FIG. 3 is a block diagram illustrating an apparatus using stochastic NQR according to a preferred embodiment of the present invention. A control unit 21, having a pulse programmer 23, and a pulsing unit 25 are provided to generate a train of random or pseudo-random RF pulses having a predetermined frequency distribution to be applied to a transmitter, such as coil 27 (coil 27 is also typically referred to as an inductor) to irradiate a target specimen.

The pulsing unit 25 includes a DC power source 29 and a capacitor 31. The DC power source 29 provides the energy necessary for generating the train of RF pulses. The control unit 21 has a central processing unit (CPU) 33 which controls the pulse programmer 23 which generates the random or pseudo random train of pulses, and initiates data acquisition.

A coupling network 35 connects the pulsing unit 25 and an RF receiver amplifier 37 to the coil 27. To convey a pulse generated from the pulsing unit 25 to the coil 27, the coupling network 35 connects the pulsing unit 25 to the coil 27 while disconnecting the RF receiver amplifier 37 from the coil 27. After a pulse is generated, the coupling network 35 disconnects the pulsing unit 25 from the coil 27 and connects the RF receiver amplifier to the coil 27 to receive a detected resonance signal during signal detection starting immediately after the end of the pulse. This sequence of connection and disconnection of the pulsing unit 25 and the RF receiver amplifier 37 repeats for each pulse generated for producing the train of pseudo-random pulses. The resonance signals are amplified by the RF receiver amplifier and sent to the control unit 21.

An RF synthesizer 39 is connected to the control unit 21 and generates a reference signal at the NQR resonance frequency for demodulating the detected resonance signal processed by the control unit 21. According to the present invention, the frequency synthesizer 39 is merely used to demodulate the detected resonance signal and time the RF pulses. Conventional techniques typically use a frequency synthesizer, in conjunction with an RF amplifier, to create a train of RF pulses. More specifically, the frequency synthesizer helps determine the frequency of the pulse in the conventional method. In contrast, the present invention determines the frequency of the pulse by the resonance frequency of passive components, i.e., the capacitor 31 and the coil 27, instead of utilizing a frequency synthesizer. This means that the frequency may be less stable in the present invention. Typically, the resonance frequency of an LC circuit will vary by a few parts per thousand due to thermal drift, and more importantly, to the change in inductance caused by inserting the test material into the inductor. However, the frequency variation is more than offset by the pulse bandwidth, i.e., a pulse width of one cycle has a bandwidth of 1000 parts per thousand. It is, of course, quite straightforward to retune the resonant circuit to the desired frequency and avoid the problems of thermal drift and sample loading.

The CPU 33 of the control unit 21 processes the resonance signals to produce a frequency domain NQR spectrum of the target sample. Conventional techniques may be used to process the resonance signal (see Garroway et. al.). The CPU 33 also compares the integrated resonance signal with a predetermined threshold value. When the predetermined threshold value is exceeded, an alarm 41 is activated in response to the comparison by the CPU 33. The control unit 21, pulsing unit 25, coupling network 35, RF receiver amplifier 37, RF synthesizer 39, and alarm 41 may be contained in a console 100.

Figure 4:
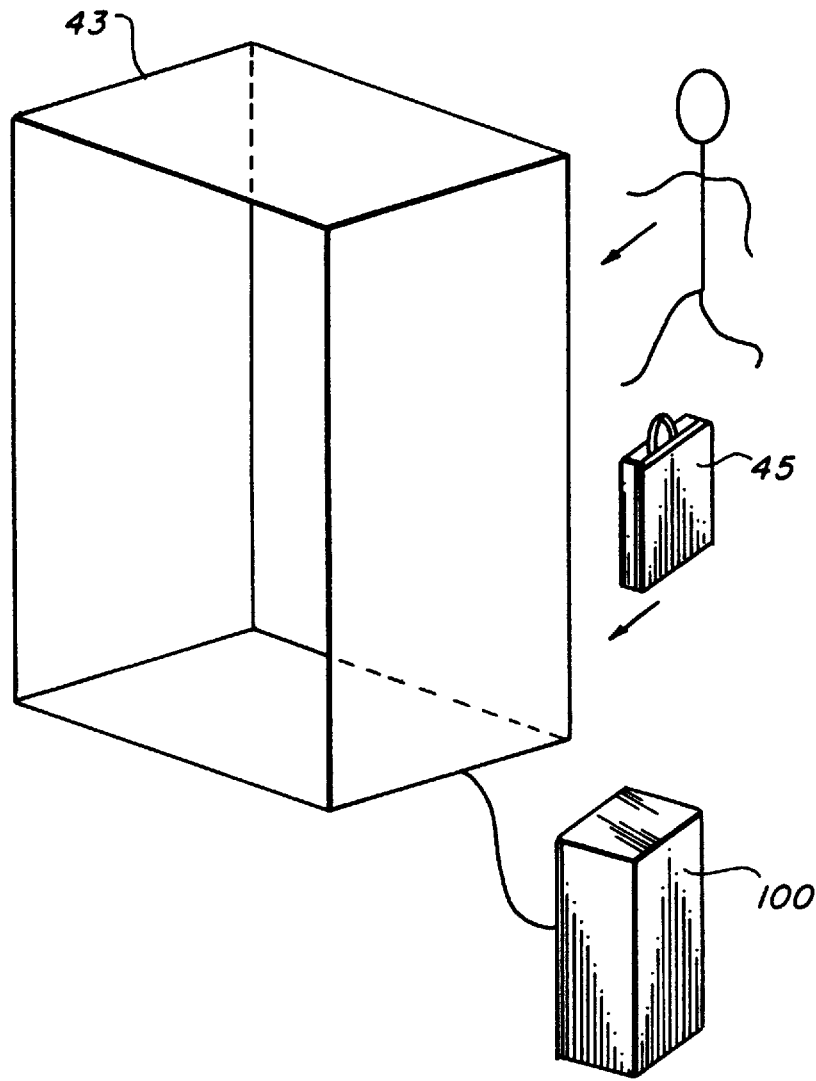
FIGS. 4, 5, and 6 illustrate various implementations of the apparatus according to the present invention.
Figure 5:
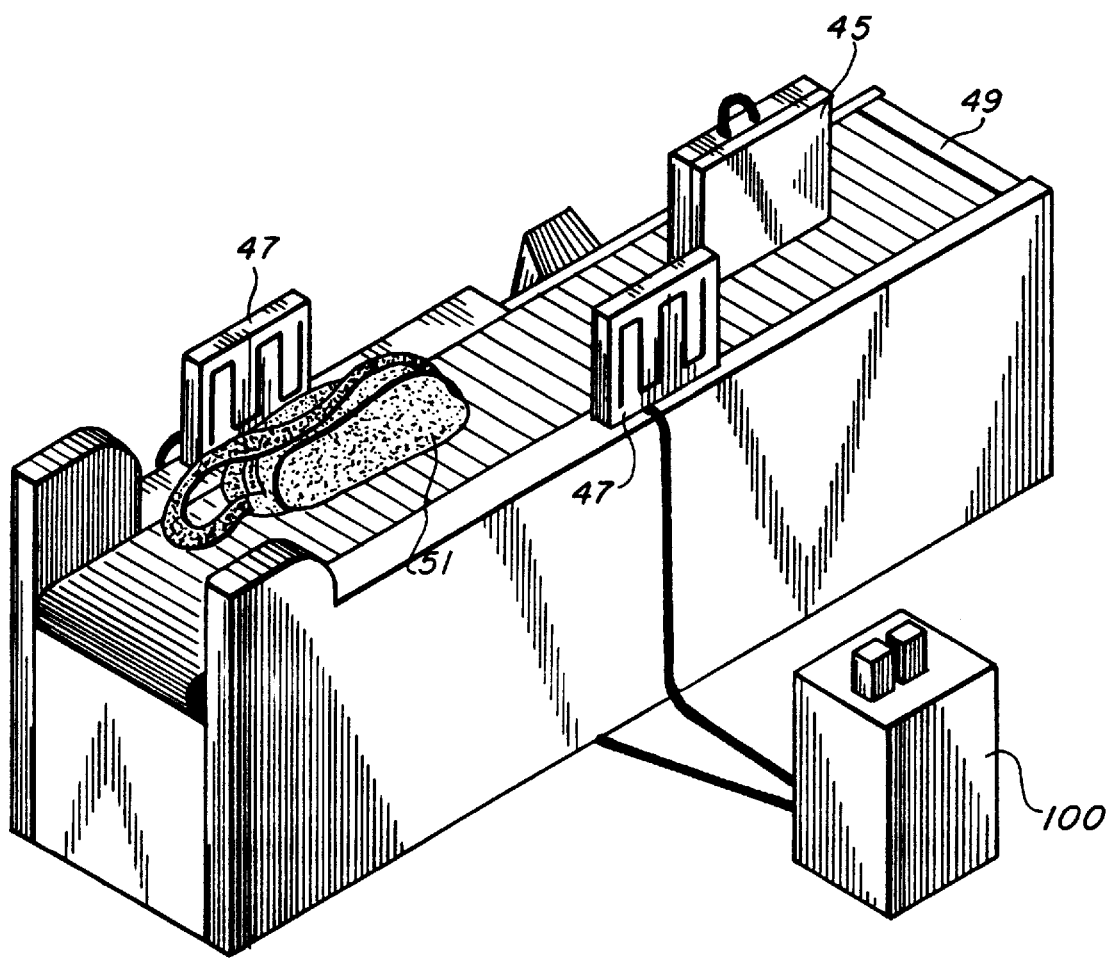
Figure 6:
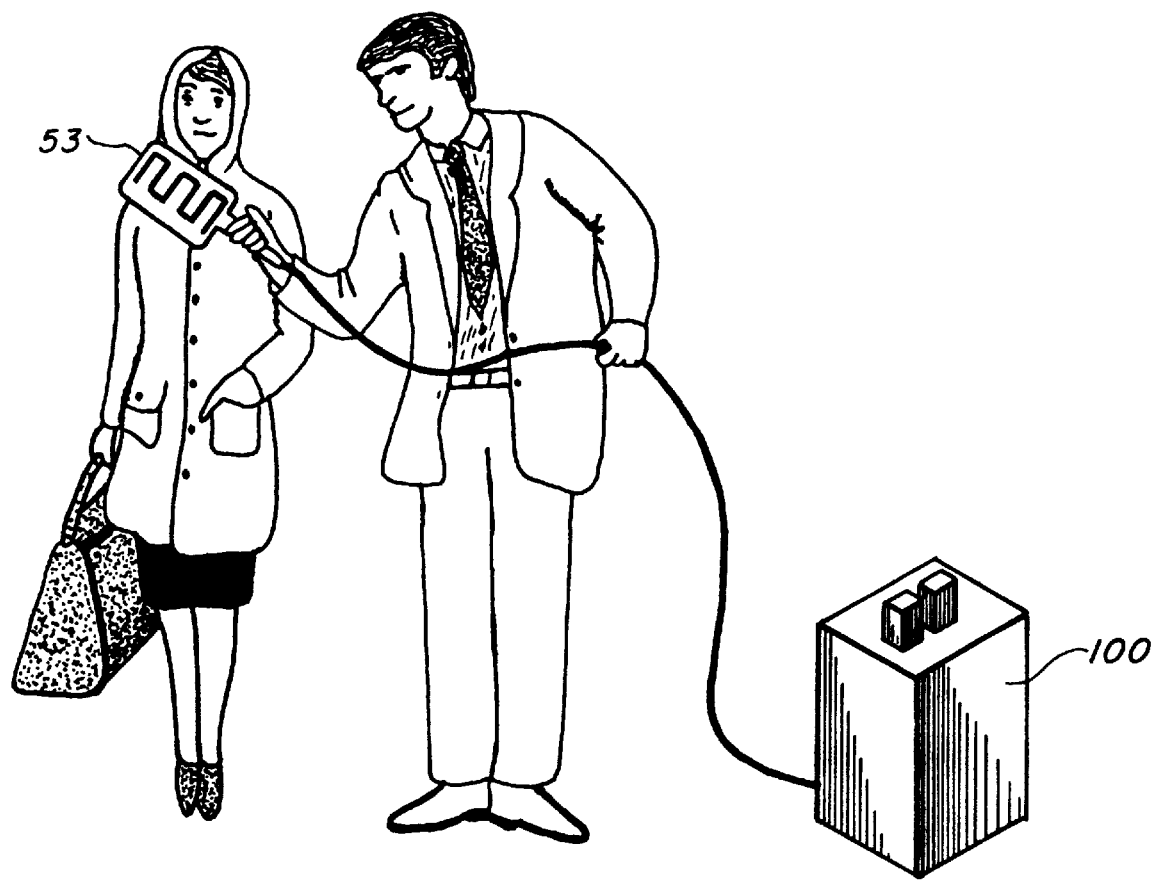

FIGS. 4, 5, and 6 depict various implementations of the apparatus according to the present invention. FIG. 4 depicts console 100 attached to a rectangular volume coil 43. A person carrying luggage 45 may pass their luggage through coil 43 for detection of small quantities of explosives or narcotics by console 100. FIG. 5 depicts console 100 connected to meanderline surface coils 47, spaced apart across a conveyor belt 49. Small quantities of explosives or narcotics in luggage 45 or bag 51 may be detected by console 100 as they pass by the coils 47. FIG. 6 depicts a console 100 attached to a hand-held meanderline surface coil 53. Detection of small quantities of explosives or narcotics may be detected on a person in a noninvasive manner by the use of coil 53. Indeed, excitation and detection by an apparatus using stochastic NQR according to the present invention may be performed by any transmitters or coils known in the art, for example, conventional "volume" coils such as a cylindrical or rectangular solenoid (e.g., coil 43 as shown in FIG. 4), a toroid, or a Helmholtz coil. In addition, a surface coil, such as a meanderline coil (e.g., coils 47 and 53 as shown in FIGS. 5 and 6) may be used. As shown in these drawings, small quantities of narcotics or explosives having quadrupolar nuclei contained in luggage 45 or bags 51 may be detected in a rapid and noninvasive manner when moving through the coil 43, passing by coils 47, or swept over by coil 53.

Figure 7:
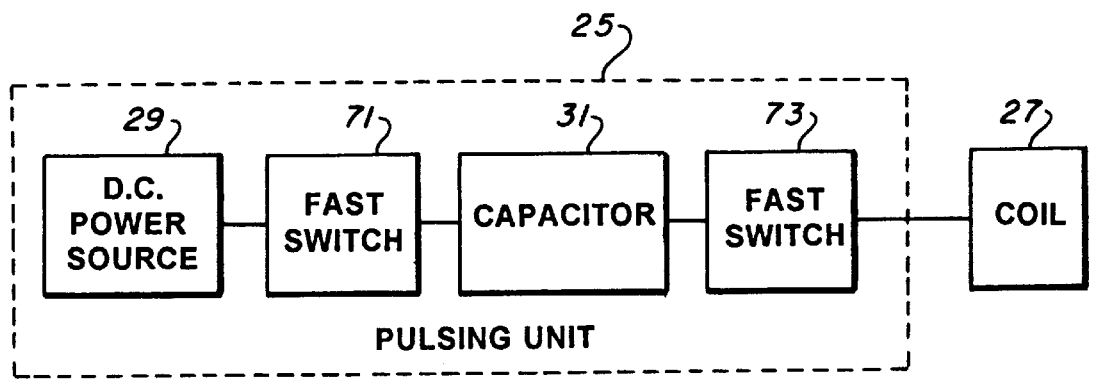
FIG. 7 is a block diagram of the components of the pulsing unit 25 of FIG. 3 according to the present invention.
Figure 8:
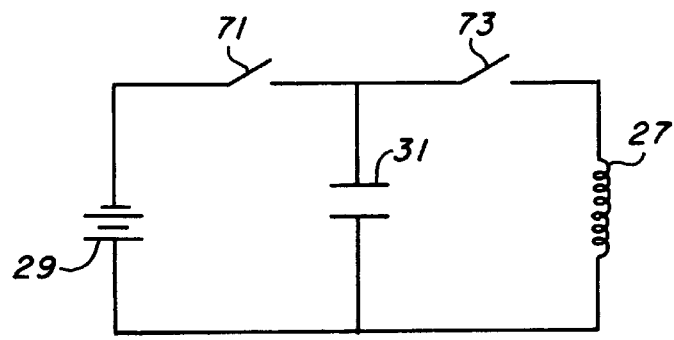
FIG. 8 is circuit diagram depicting the electrical relationship between the components of the pulsing unit 25 and the coil 27 according to the present invention.

FIG. 7 further illustrates the pulsing unit 25 of the present invention. The DC power source 29 is connected via a fast switch 71 to the capacitor 31. The capacitor 31 is connected via a fast switch 73 to the inductor coil 27, through the coupling network 35 (not depicted in FIG. 7, but see FIG. 3). The DC power source 29 may be a conventional power source to provide power to the capacitor 31 for a number of pulses. The fast switches 71 and 73 may be conventional switches including, but are not limited to, pin diodes, switching diodes, half wave rectifiers, FETs, and SCRs, that can cut off an RF pulse signal at a half-cycle. The speed of the switch depends on the desired radio frequency generated. FIG. 8 depicts a tank circuit with the DC power source 29, the capacitor 31, the coil 27, and the fast switches 71 and 73 according to the present invention.

Initially, capacitor 31 is charged by DC power source 29 with fast switch 71 closed and fast switch 73 open. After the capacitor 31 is charged to the proper voltage, fast switch 71 is opened to disconnect the capacitor 31 from the DC power source 29. Fast switch 73 is then closed to connect the capacitor 31 to the inductor coil 27, via the coupling network 35 (not shown) to generate an RF pulse. The ohmic losses which cause the voltage to decay during the pulse are inversely proportional to Q, therefore a high Q inductor is desirable.

Figure 9:
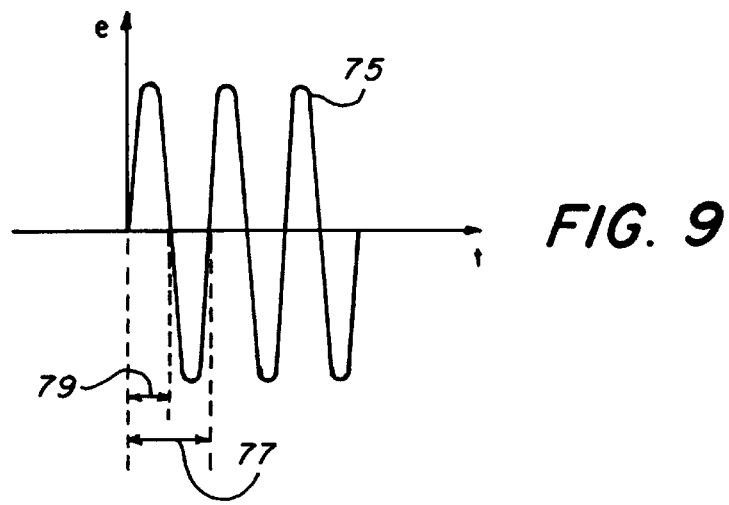
FIG. 9 is a graph illustrating the current flowing through the coil 27 when fast switch 73 of FIG. 7 remains closed; and, FIG. 10 is a diagram illustrating a train of pseudo-random pulses generated by an apparatus according to the present invention.

FIG. 9 illustrates a RF pulse signal 75 generated if fast switch 73 is left in a closed position, connecting the capacitor 31 to the coil 27. When the capacitor 31 is connected to the inductor coil 27, an alternating current passes through the coil 27 with a characteristic frequency of $\omega=1/(LC)^{1/2}$. L and C are chosen such that $\omega$ equals the NQR resonance frequency of the nuclei desired to be detected. The time for each cycle 77 is $2\pi/\omega$. Thus, the duration for half-cycle 79 is $\pi/\omega$ or $\pi(LC)^{1/2}$.

According to the present invention, the fast switch 73 disconnects the capacitor 31 from the coil 27 after a half-cycle 79 or multiples thereof (i.e., at the zero crossings of the alternating current). For example, a passive component, such as a diode, may be connected between the coil 27 and the switch 73 to automatically cut off current flow through coil 27 at the first zero-crossing of the current. Other passive or active components, including half wave rectifiers, FETs, SCRs, or other components well-known in the art that can respond to zero-crossings, may also be used in combination with switch 73 to cause switching at zero-crossings of the alternating current. As a result, substantially no recovery delay is experienced by the apparatus (as discussed further below). Moreover, most of the charge is restored to the capacitor 31, the voltage being decreased only by ohmic losses in the fast switch 73 and in the coil 27. Thus, after an RF pulse is generated, the capacitor 31 may have a remaining charge for further pulses, or the fast switch 71 may be closed to recharge the capacitor 31.

Figure 10:
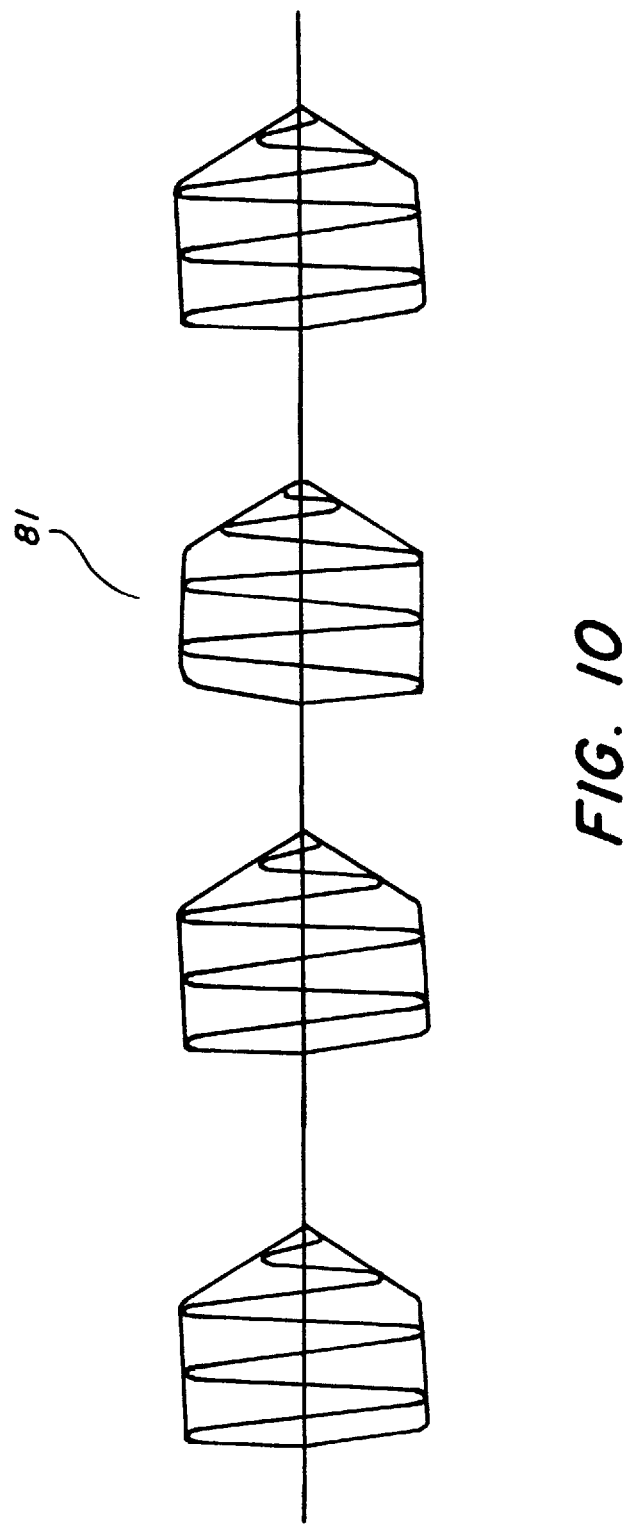

The CPU 33 and the pulse programmer 23 control the opening and closing of the fast switches 71 and 73 to produce the random or pseudo-random sequencing of the RF pulses. FIG. 10 depicts an example of a train of pseudo-random RF pulses 81 generated by the apparatus according to the present invention. The RF pulse signals in this pseudo-random RF pulse train will have equal amplitude and frequency, but are pseudo-randomly shifted between 0° and 180° phases.

With a circuit according to the present invention, the speed for generating an RF pulse is increased. When a pulse is to be generated with conventional methods (e.g., via use of an RF power amplifier, instead of a pulsing unit 25), a pulse rise delay 13 is experienced before the pulse reaches a cycle having a full amplitude 5 (as discussed above with reference to FIG. 2). The length of the pulse rise delay depends on the Q of a coil and the desired RF generated. Typically, only 70% of the full amplitude is achieved in $Q/\pi$ cycles of RF. For example, for a circuit with a Q of 600 generating a pulse signal with $\omega$ at 1 MHz, the pulse rise delay may be on the order of 200 $\pi$s.

Unlike conventional methods, there is no pulse rise delay 13 in the pulses generated by the apparatus of the present invention (see e.g., FIG. 10). The DC power source 29 need only recharge the capacitor 31—it need not supply the instantaneous power required to rapidly energize the coil 27. The energy necessary for pulse generation is already stored in the capacitor 31 before the pulse is started. With the pulsing unit 25 according to the present invention, the RF pulse signal can reach full amplitude within a mere quarter-cycle because the pulse energy is already stored in the LC tuned circuit when the capacitor 31 is connected to the coil 27. Thus, there is substantially no pulse rise delay in generating the RF pulse, and very short and rapid RF pulses 81 may be generated.

In addition, while the pulse may have any duration of time, it is advantageous to open fast switch 73 to disconnect the capacitor 31 from the coil 27 after a half-cycle 79 (see FIG. 9) or multiples thereof (i.e., at the zero crossings of the alternating current) according to the present invention. In pulsed magnetic resonance, the nuclear induction signal can only be detected after the circuitry recovers from the overload caused by the transmission of an RF pulse. For a single coil employed both as transmitter and receiver, a rough rule of thumb is that a useful signal cannot be obtained until about twenty time constants ($20 \times Q/\pi f$) have elapsed since the RF pulse signal was turned off (due to the "ringing" or dissipation of the energy in the inductor after the pulse was transmitted).

According to the present invention, disconnecting the capacitor 31 from the coil 27 at the zero crossings of the alternating current leaves almost no energy in the coil 27 to be dissipated at the end of the RF pulse signal. The pulse decay time (or recovery delay 15) is substantially zero and the nuclear resonance signal detection can begin almost immediately (i.e., within $Q/\pi$ cycles of the RF signal) after the RF pulse signal is turned off. In other words, there is substantially no recovery delay (i.e., a recovery delay of less than $Q/\pi$ cycles of the RF pulse signal). Thus, recovery time before resonance signal detection is considerably shortened, facilitating the generation of the very short and rapid RF pulses necessary for stochastic NQR. Indeed, the detection recovery time may only be dictated by the time required to switch between the pulsing unit 25 and the receiving components (e.g., RF receiver amplifier 37) when the same coil 27 is used for detection.

Use of the pulse-generating device according to the present invention also results in substantial cost savings over conventional systems. According to the present invention, the high power RF amplifier of conventional systems may be replaced by a DC power supply and a few inexpensive electronic components. Thus, reduced hardware requirements lead to economies of scale and lower costs of development.

The present invention is not limited to the stochastic NQR apparatus described above. For instance, use of the same transmitting device (i.e., coil 27) for both irradiating the sample and detecting the resonance signal is not required. A separate means for detecting the resonance signal may be employed instead. In other words, separate irradiation and detection devices (e.g., coils) may be used instead. In a coaxial inductor scheme, a detection inductor is tuned to the NQR frequency, is appropriately matched to the transmission line, is coaxial with the pulse-generating inductor, and is coupled to and decoupled from the pulse-generating inductor during pulsing. For detection by a coaxial inductor scheme, the recovery time will only be determined by how well the inductors are decoupled from each other (e.g., a few tens of microseconds).

Moreover, while it is important to maintain the phase coherence between the RF pulses and the NQR frequency, for lower NQR frequencies, it may be adequate to time the pulses with the CPU clock and digitize the NQR signal without demodulation. NQR detection is traditionally accomplished by demodulating the signal with a reference signal at the NQR frequency obtained from a frequency synthesizer (e.g., RF synthesizer 39). However, the timing of the pulses can be locked to the synthesizer frequency so that the pulses always start at the same point in the RF cycle, and thus maintain phase coherence. Thus, with low NQR frequencies, phase coherence may be accomplished by merely locking the pulses with the CPU clock and digitizing the NQR signal without demodulation.

Furthermore, instead of merely opening and closing fast switch 73 to produce the pseudo-random RF pulses, other embodiments of the present invention may employ a shift-register pseudo-random sequencer (i.e., a series of TTL logic components) or other software-generated virtual circuit to provide the pseudo-random sequencing of the RF pulses (see Garroway et. al.).

The present invention is also applicable to NMR applications, as mentioned above. Stochastic NMR has already been demonstrated, but at higher RF frequencies for which conventional means may be employed to produce short RF pulses. Typically, the frequencies in NMR are well above 10 MHz. However, for nuclei with very low magnetogyric ratios and/or for nuclei examined in low magnetic field, such as the earth's field, the NMR frequencies can be below 10 MHz. Thus, the pulse generating device according to the present invention may also be used in NMR techniques, especially in the low frequency regime, e.g., below 10 MHz. The use of short pulse technology according to the present invention may extend the use of stochastic NMR to much larger sample volumes and much cheaper spectrometers for those low frequency NMR applications (such as process monitoring and control that typically involve large, low field magnets and hence low RF frequencies).

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An apparatus, comprising:

a pulsing unit to generate a radio frequency pulse for nuclear magnetic or nuclear quadrupole resonance, and a transmitter to irradiate a specimen with the pulse, wherein the pulse has a signal reaching a full amplitude within a quarter cycle, the signal having a recovery delay of less than $Q/\pi$ cycles the Q being a quality factor of the transmitter.

2. An apparatus as recited in claim 1, wherein said pulsing unit includes:

a capacitor;

a first switch to couple said capacitor to an external DC power source; and a second switch to couple said capacitor to said transmitter, wherein said external DC power source charges said capacitor when said first switch is closed, and when said first switch is opened, said capacitor generates the radio frequency pulse through said transmitter by closing said second switch and opening said second switch when a voltage across said transmitter is zero.

3. The apparatus as recited in claim 2, wherein said transmitter is an inductive coil.

4. An apparatus, comprising:

pulsing means for generating a train of pseudo-random radio frequency pulses for stochastic nuclear quadrupole resonance, and a transmitter to irradiate a specimen with the train of pseudo-random radio frequency pulses, wherein each of the pulses has a radio frequency signal reaching a full amplitude within a quarter-cycle, the radio frequency signal having a recovery delay of less than $Q/\pi$ cycles, the Q being a quality factor of said transmitter.

5. An apparatus as recited in claim 4, wherein said pulsing means includes:

a capacitor;

a first switch to couple said capacitor to an external DC power source; and a second switch to couple said capacitor to said transmitter, wherein said external DC power source charges said capacitor when said first switch is closed, and when said first switch is opened, said capacitor generates each of the pulses through said transmitter by closing said second switch and opening said second switch when a voltage across said transmitter is zero.

6. The apparatus as recited in claim 5, wherein said transmitter is an inductive coil.

7. An apparatus as recited in claim 4, wherein said pulsing means includes:

a capacitor;

power means for charging said capacitor;

first coupling means for coupling and decoupling said capacitor with said power means;

second coupling means for coupling and decoupling said capacitor with said transmitter; and zero detection means for detecting a zero voltage across said transmitter, wherein said power means charges said capacitor when said first coupling means couples said capacitor with said power means, and when said first coupling means decouples said capacitor from said power means, said second coupling means couples said capacitor with said transmitter to generate one of the pulses through said transmitter and decouples said capacitor from said transmitter when said zero detection means detects the zero voltage across said transmitter.

8. A method using magnetic or nuclear quadrupole resonance, comprising the step of:

generating a radio frequency pulse through a transmitter, wherein the pulse has a signal reaching a full amplitude within a quarter-cycle, the signal having a recovery delay of less than $Q/\pi$ cycles, the Q being a quality factor of the transmitter.

9. A method as recited in claim 8, wherein said step of generating includes the steps of:

closing a first switch that couples an external DC power source to a capacitor to charge the capacitor;

opening the first switch and closing a second switch that couples the capacitor to a transmitter to generate the pulse through the transmitter; and opening the second switch when a voltage across the transmitter is zero.

10. The method as recited in claim 9, wherein said transmitter is an inductive coil.

11. A method using stochastic nuclear quadrupole resonance, comprising the step of:

generating a train of pseudo-random radio frequency pulses through a transmitter, wherein each of the pulses has a radio frequency signal reaching a full amplitude within a quarter-cycle, the radio frequency signal having a recovery delay of less than $Q/\pi$ cycles, the Q being a quality factor of the transmitter.

12. A method as recited in claim 11, wherein said step of generating includes the steps of:

closing a first switch that couples an external DC power source to a capacitor to charge the capacitor;

opening the first switch and closing a second switch that couples the capacitor to a transmitter to generate each of the pulses through the transnitter; and opening the second switch when a voltage across the transmitter is zero.

13. The method as recited in claim 12, wherein said transmitter is an inductive coil.

* * * * *